United States Patent
Podlowski (10) Patent No.: US 11,329,178 B2
(45) Date of Patent: May 10, 2022

(54) DOUBLE-GLASS PHOTOVOLTAIC MODULE

(71) Applicant: Solyco Technology GmbH, Berlin (DE)

(72) Inventor: Lars Podlowski, Berlin (DE)

(73) Assignee: SOLYCO TECHNOLOGY GMBH, Berlin (DE)

( * ) Notice: Subject to any disclaimer, the term of this patent is extended or adjusted under 35 U.S.C. 154(b) by 0 days.

(21) Appl. No.: 16/752,720

(22) Filed: Jan. 27, 2020

(65) Prior Publication Data
US 2020/0243705 A1    Jul. 30, 2020

(30) Foreign Application Priority Data

Jan. 28, 2019  (EP) .................................... 19154003

(51) Int. Cl.
| H01L 31/048 | (2014.01) |
| H02S 20/23 | (2014.01) |
| H02S 30/10 | (2014.01) |
| H02S 40/12 | (2014.01) |

(52) U.S. Cl.
CPC .......... H01L 31/0488 (2013.01); H02S 20/23 (2014.12); H02S 30/10 (2014.12); H02S 40/12 (2014.12)

(58) Field of Classification Search
CPC ..... H01L 31/0488; H02S 20/23; H02S 30/10; H02S 40/12
See application file for complete search history.

(56) References Cited

U.S. PATENT DOCUMENTS

2006/0219291 A1* 10/2006 Hikosaka ................ H02S 20/00
                                                                 136/251
2013/0056044 A1* 3/2013 Ravi ....................... H01L 31/048
                                                                 136/245
2013/0206230 A1* 8/2013 Sridharan ............... H01L 23/10
                                                                 136/259
2014/0261664 A1* 9/2014 Polcyn .............. H01L 31/02168
                                                                 136/256
2015/0194557 A1* 7/2015 Williams ................ H02S 30/10
                                                                 136/248
2017/0133529 A1* 5/2017 Thiel ..................... H01L 31/048

FOREIGN PATENT DOCUMENTS

| EP | 1708280 A1 | 10/2006 |
| KR | 20150136718 A | 12/2015 |
| WO | WO 2012012745 A2 | 1/2012 |

OTHER PUBLICATIONS

Abrisa Technologies, Custom Glass Fabrication Capabilities Technical Reference Document (Year: 2017).*

* cited by examiner

Primary Examiner — Jayne L Mershon
(74) Attorney, Agent, or Firm — Leydig, Voit & Mayer, Ltd.

(57) ABSTRACT

A solar panel comprises a double-glass photovoltaic module mounted in a frame. The double-glass photovoltaic module comprises a plurality of solar cells embedded between a front glass sheet and a rear glass sheet. The rear glass sheet exhibits a larger extension than the front glass sheet, in at least two spatial directions, as measured in the rear glass sheet plane. The frame comprises a clamping element clamping only the rear glass sheet and not the front glass sheet of the double-glass photovoltaic module. The front glass sheet is either flush with a plane defined by inner edges of a front face of the frame or protrudes beyond the front face of the frame.

13 Claims, 4 Drawing Sheets

DOUBLE-GLASS PHOTOVOLTAIC MODULE

CROSS-REFERENCE TO PRIOR APPLICATION

Priority is claimed to European Patent Application No. EP 19154003.8, filed on Jan. 28, 2019, the entire disclosure of which is hereby incorporated by reference herein.

FIELD

The invention relates to a solar panel with a double-glass photovoltaic module and to a photovoltaic power station.

BACKGROUND

Single-glass photovoltaic modules are widely known in the art. In this kind of photovoltaic module, the solar cells are encapsulated between protective films, such as ethylene vinyl acetate (EVA) films, and further protected by a highly transparent front glass sheet of several millimeter thickness, and an electrically insulating flexible foil on the rear side. The laminate is typically mounted to a metal frame. The frame provides mechanical stabilization and edge protection for the laminate. Thus, with this type of photovoltaic module, the laminate or stack comprising the front glass sheet, the solar cells, and the protective backside film are together mounted in the frame to form a solar panel.

In recent years, manufacturers have increasingly pushed the use of double-glass photovoltaic modules. In this type of photovoltaic modules, the solar cells are embedded between two glass sheets, namely, a front glass sheet and a rear glass sheet. An encapsulation of the solar cells by encapsulating films is typically also used. For so-called "bifacial solar cells" double-glass photovoltaic modules allow increasing the active surface area for generating electrical power by additionally using the rear side of the solar cells for electrical power generation. Furthermore, due to the increased mechanical stability of this design in comparison to single-glass modules, mechanical stabilization by a frame is per se not a requirement for double-glass photovoltaic modules. However, a double-glass photovoltaic module is sensitive to receiving damage on the edges of the glass sheets due to improper mechanical handling during transport, installation and maintenance, possibly even resulting in breakage and therefore complete failure of the photovoltaic module.

SUMMARY

In an embodiment, the present invention provides a solar panel comprising a double-glass photovoltaic module mounted in a frame. The double-glass photovoltaic module comprises a plurality of solar cells embedded between a front glass sheet, which is to be arranged facing towards the sun in operation of the solar panel, and a rear glass sheet. The rear glass sheet exhibits a larger extension than the front glass sheet, in at least two spatial directions, as measured in a plane of the rear glass sheet plane. The frame comprises a clamping element clamping only the rear glass sheet and not the front glass sheet of the double-glass photovoltaic module. The front glass sheet is either flush with a reference plane defined by inner edges of a front face of the frame or protrudes beyond the front face of the frame.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

In an embodiment, the present invention provides a solar panel comprising a double-glass photovoltaic module mounted in a frame. The double-glass photovoltaic module comprises a plurality of solar cells embedded between a front glass sheet, which is to be arranged facing towards the sun in operation of the solar panel, and a rear glass sheet. The rear glass sheet exhibits a larger extension than the front glass sheet, in at least two lateral spatial directions, as measured in the rear glass sheet plane. The frame comprises a clamping element clamping only the rear glass sheet and not the front glass sheet of the double-glass photovoltaic module. In the solar panel of the present invention, the front glass sheet is either flush with a reference plane defined by inner edges of a front face of the frame or protrudes beyond the front face of the frame.

An embodiment of the invention is based on the recognition that improper mechanical handling of a double-glass photovoltaic module during transport, installation and maintenance cannot be safely avoided. Contrary to recent trends in the art, the invention therefore builds on the assumption of continued use of a frame also for double-glass photovoltaic modules.

The inventor has further recognized that cleaning requirements imposed by the use of a frame are inter alia caused by the frame protruding over the glass sheet plane and thus forming a protruding inner frame edge that hinders water drainage from the photovoltaic module, and that in winter also prevents slipping of snow. Thus, particularly where solar panels are mounted at a rather low tilt angle with respect to ground, poor drainage of water and snow results, causing a quick formation of dirt coverage on the active area photovoltaic module, not only near its edges. In absence of frequent cleaning, this would indeed lead to losses in electrical performance during operation. Furthermore, the edge between the front glass sheet and the frame is particularly susceptible to processes such as biofouling. These processes exert a degrading influence on the sealing material, such that, eventually, water may enter the seal and damage the photovoltaic module.

In the solar panel of an embodiment of the present invention, however, with the rear glass sheet extending beyond the dimensions of the front glass sheet in at least two spatial directions, the double-glass photovoltaic module is mounted, i.e., mechanically clamped on only the rear glass sheet by a clamping element that is an integral part of the frame profile. This design achieves that the front glass sheet, in a mounted state, is laterally adjacent to an inner edge of the frame. A protrusion of the inner edge of the frame is thus avoided in comparison with known solar panel designs, achieving a solar panel with improved drainage in the mounted state. The protrusion of the inner edge of the frame is completely avoided by proper mutual adaptation of the frame design and the module design.

Since only the rear glass sheet of the double-glass photovoltaic module is clamped by the clamping element of the frame profile and thus supported by the frame in its outer or edge region, the photovoltaic module is fixed in position by means of interaction of the frame engaging with the rear glass sheet alone. As indicated above, a protrusion of the inner edge of the frame is achieved by proper design of the frame in dependence on the given module design, for instance by providing the clamping element in the frame profile in a position that fixes the rear side plane of the rear glass sheet of the module at a suitable distance from the reference plane defined by the inner edges of a front face, which distance amounts to at most the total thickness of the double-glass photovoltaic module. If the distance is smaller than the total thickness of the double-glass photovoltaic module, the module protrudes from the front face of the frame. If the distance is equal to the total thickness of the double-glass photovoltaic module, the front glass sheet is flush with a reference plane defined by inner edges of a front face of the frame. In other words, the front face of the front glass sheet is flush with the front face of the panel.

This particular design yields the advantage that, on the one hand, importantly, surface edges where potentially chemically and/or biologically active agents and/or snow may settle are effectively avoided. On the other hand, with the frame partially or entirely locking around the double-glass photovoltaic module, the rigidity of the assembly is improved in comparison with plain double-glass photovoltaic modules. Thus, the solar panel is significantly less prone to damage during transport and installation, thus adding to the flexibility of the solar panel in terms of designated installation locations for example. The solar panel of invention thus avoids the described disadvantages of using a frame for edge protection and allows combining the advantages of edge protection with the advantage of avoiding a formation of dirt near the edges of the frame on the surface of the front glass sheet of the double-glass photovoltaic module. This in turn improves the performance and reduces requirements for cleaning and maintenance or even repair in field operation of the solar panel.

It is noted that the use of the terms "front glass sheet" and "rear glass sheet" is intended to imply that it is the front glass sheet which is to be arranged facing towards the sun in operation of the solar panel, while the rear glass sheet is to be arranged facing away from the sun in operation of the solar panel.

Furthermore, it is noted that the term "reference plane" mentioned in the present specification is used for explanatory purposes only and does not refer to a tangible structural element of the solar panel.

In the following, embodiments of the solar panel of the invention are described.

In a preferred embodiment, the rear glass sheet of the double-glass photovoltaic module has a rectangular shape. This particular shape facilitates an easy and thus, cost efficient mounting of the module, as it allows standard fasteners and, if required, standard frame profiles to be employed, in order to provide a connection between the rear glass sheet and the mounting surface. In one variant of this embodiment, the rear glass sheet has the shape of a square.

In alternative embodiments, the shape of the rear glass sheet of the double-glass photovoltaic module or the entire double-glass photovoltaic module is circular or has any other technologically feasible shape. Even in the case, where the rear glass sheet assumes a circular shape, the rear glass sheet can nevertheless be used to mount the entire double-glass photovoltaic module due to its larger extension in comparison with the front glass sheet.

Three different groups of embodiments have different geometries used for implementing the larger extension of the rear glass sheet in comparison with the front glass sheet.

In one of these groups of embodiments, the rear glass sheet of the double-glass photovoltaic module extends beyond opposite edges of the front glass sheet on only two opposite sides thereof. In the solar panel of this embodiment, the rear glass sheet alone is clamped by the frame on only these two opposite sides where the rear glass sheet has a larger lateral extension than the front glass sheet. With this embodiment, the advantage is obtained that the photovoltaic module may be mounted safe and securely, utilising the rear glass sheet, with a minimum of fastening means.

In an advantageous variant of this embodiment, the solar panel has a frame that protrudes from the reference plane and beyond the front glass sheet on those other opposite sides of the frame, which do not clamp the rear glass sheet. In other words, the front glass sheet is flush with or protrudes from the front plane of frame parts only on those two opposite sides of the frame that do clamp only the rear glass sheet. In a rectangular double-glass photovoltaic module, the other two mutually opposite sides of the module may or may not by clamped by the frame. Any suitable clamping element in the frame profile on these other sides accommodates the full thickness of the module including the front and the rear glass sheets. Thus, different frame profiles may by required for clamping the two different pairs of opposite sides of the module.

Considering an installation of the solar panel in the field with an inclination to ground (the ground being assumed to be flat horizontal for simplicity of explanation), this embodiment allows water and snow to completely run off from the solar panel by force of gravity via the lower one of the two (horizontal) frame edges that are flush with front glass sheet. Herein, "lower frame edge" means the frame edge having a shorter distance to ground, and "upper frame edge" means the frame edge having a longer distance to ground. This embodiment of the solar panel allows the use of a known standard frame profile for the inclined frame sides.

In multi-panel array installations using this embodiment of the solar panel, for instance in installations on inclined roofs, lower and upper edges of vertically neighboring solar panels are suitably mutually flush or installed in a shingled manner such that water or snow is not blocked on its way down to ground from the upper next neighboring solar panel.

The formation of dirt or dust on the surface of the front glass sheet is also avoided with this embodiment, even though the inclined (vertical) edges of the panel protrude beyond the front glass sheet.

In a further group of embodiments, the rear glass sheet of the double-glass photovoltaic module extends beyond edges of the front glass sheet on only two mutually orthogonal sides thereof.

In another, currently preferred group of embodiments, the rear glass sheet of the double-glass photovoltaic module extends beyond all edges of the front glass sheet. With this particular embodiment, it is possible to have a frame lock around the entire rear glass sheet of the double-glass photovoltaic module. This design thus allows achieving a particularly high-level protection of the photovoltaic module against damage potentially done to the module during the transport of the module and/or during mounting and service stages.

From the three different groups of embodiments of double-glass photovoltaic module highlighted in the above, it is clear that the solar panel of the present invention advantageously reduces cleaning and maintenance requirements in operation without complicating the mounting procedure during fabrication, but also increases the flexibility of the photovoltaic module installation in the field. Yet at the same time, the reliability and safety of the photovoltaic module installation is not compromised. And the energy production is increased because modules will remain cleaner.

The glass material used for the front and rear glass sheets is different in different embodiments. In some embodiments, the glass material is a tempered glass, which has the advantage of providing particular mechanical strength compared with normal glass. However, in other embodiments, normal, i.e., untempered glass or semi-tempered glass is used.

In another embodiment, edges of the front glass sheet that face away from the solar cells are polished edges. Although it is possible to make use of simply machined, i.e., cut or chamfered edges of the front glass sheet in certain other embodiments, polished edges of the present embodiment provide the particular advantage to avoid additional surfaces or edges and improve optical properties. In particular, this additionally avoids a build-up of chemically and/or biologically active agents in the region concerned, such that said agents, water for example, cannot degrade the seal between the front and the rear glass sheet or the photovoltaic module and the fastening means.

In a further embodiment, the plurality of solar cells of the double-glass photovoltaic module is embedded between a top bedding material and a bottom bedding material. This bedding material may be appropriately selected from, but is not limited to, one of the following materials. The bedding may be made from a polymer, such as ethylene-vinyl acetate (EVA), a polyolefin elastomer (POE)-based material, polyvinylbutyral (PVB), ionomers or silicone. In addition, the material selected for the top bedding may differ from the material of the bottom bedding. As the material for the bedding is to be selected from a wide range of materials with differing physical properties, the material may be chosen such that it yields the highest resistance against, for example, water-induced degradation or the like. This, advantageously, provides a high level of flexibility regarding the installation location of the solar panel and, also a high level of protection of the solar cells from environmental influences.

In a preferred embodiment, the plurality of solar cells of the double-glass photovoltaic module is embedded between a front glass sheet and a rear glass sheet with a clearance in between, whereas the clearance is filled with air or gas. With this particular embodiment, the advantage is acquired that an air- or gas-filled clearance between the front and the rear glass sheet and the solar cells effectively isolates the solar cells. Additionally, an air- or gas-filled clearance may be utilised as a detection means for a compromised photovoltaic module seal. That is, if the pressure in the clearance is sufficiently above or below the ambient pressure, a normalisation of the pressure in the clearance indicates a damaged seal which, in turn, may trigger a service action before the actual solar cells may be damaged.

In some embodiments, the double-glass photovoltaic module comprises a bifacial arrangement of the solar cells between the front glass sheet and the rear glass sheet. A monofacial arrangement is used in other embodiments.

In another embodiment, the clamping element exhibits a C-shape. That is, both, the clamping groove of the frame and the outer or edge region of the rear glass sheet, have a complementary, mutually matching C-shape. This design provides the particular advantage that, firstly, during the assembly process, the double-glass photovoltaic module is automatically well aligned with the frame of the solar panel. Secondly, the double-glass photovoltaic module is instantly held tightly in position which, reliably, prevents the glass of the photovoltaic module from chipping due to an undesired motion of module in its frame.

In a further embodiment of the invention, the rear glass sheet is additionally secured in the clamping groove by a longer extension of the clamping means on the side of the rear glass sheet. In the case of solar panels of large dimensions, it is desirable to further support the rear glass sheet and thus, the entire double-glass photovoltaic module which adds to the stability of the whole solar panel. This feature provides the advantage that even rather large solar panels may be implemented which results in a higher energy production.

In another preferred embodiment, a gap is formed between an inner surface of the frame and the front glass sheet of the photovoltaic module. This gap is filled with an elastic sealing agent to seal the photovoltaic module against the frame, and the sealing agent is either flush with a front face of the frame or protrudes beyond the reference plane defined by the inner edges of the front face of the frame, but not beyond a plane defined by a front face of the front glass sheet.

With the sealing agent sitting flush with a front face of the frame and not protruding beyond the front face of the front glass sheet, the seal between the frame and the double-glass photovoltaic module adds to the ability of the solar panel to avoid an undesirable build-up of chemically and/or biologically active agents and/or snow on the solar panel. This gives the advantage of effectively protecting the photovoltaic module against environmental influences, reduction of the number of cleaning cycles required and also extending the lifespan of the seal.

The sealing agent used to fill the gap between the frame and the photovoltaic module may be chosen freely. Preferably, however, the sealing agent may be a ductile rubber material or, may be a viscous sealing material such as a silicone- or acryl-based sealing compound.

In addition to, or alternatively to the clamping element which aligns the double-glass photovoltaic module with the frame and fixes it in position relative to the frame, the photovoltaic module may be glued into the frame. In accordance with the invention, it is possible to employ the same glue/sealing agent to fix the photovoltaic module in position and to seal the gap between the frame and the module. This may further be accomplished in a single process step or, may be done in two separate process steps. That is, the photovoltaic module may be first glued into the frame and, subsequently, the gap may be filled with the chosen sealing agent or glue and vice versa.

In another embodiment of the invention, a photovoltaic power station is provided. The photovoltaic power station, according to an embodiment of the invention, comprises at least one solar panel according to an embodiment of the invention. The photovoltaic power station shares the advantages of the solar panel.

For simplicity, in the Figures, those details of the structure of the respective embodiments double-glass photovoltaic module, which are not required for conveying their main features, are not shown. Furthermore, even though different variants are shown throughout the Figures, some of the reference labels used are identical where appropriate to allow an easier identification of like features in the different variants.

Figure 1A:
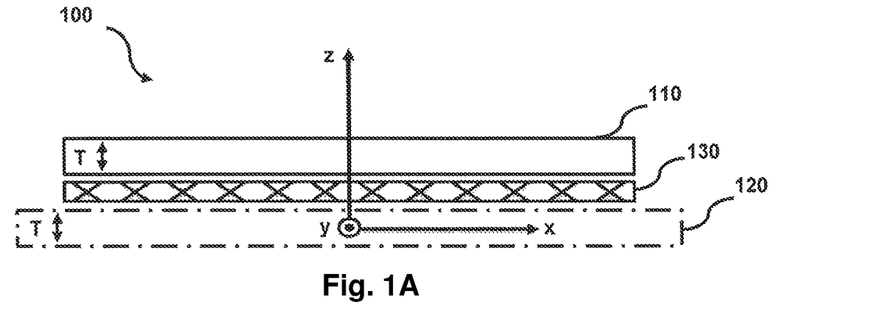
FIG. 1A shows a schematic side view of an embodiment of a double-glass photovoltaic module, comprising a plurality of solar cells, embedded between a front glass sheet and a rear glass sheet.

FIG. 1A shows a schematic side view of an embodiment of a double-glass photovoltaic module 100, comprising a plurality of solar cells 130, embedded between a front glass sheet 110 and a rear glass sheet 120. The rear glass sheet 120 is shown as a dotdashed line, in order to highlight the fact that that the rear glass sheet 120 exhibits a larger extension than the front glass sheet 110, in at least two spatial directions, as measured in the rear glass sheet plane. In accordance with FIG. 1A that larger extension of the rear glass sheet is shown in the positive and the negative x-direction. For simplicity, those details of the structure of the double-glass photovoltaic module 100, which are not required for conveying main features of the present invention, are not shown.

Figure 1B:
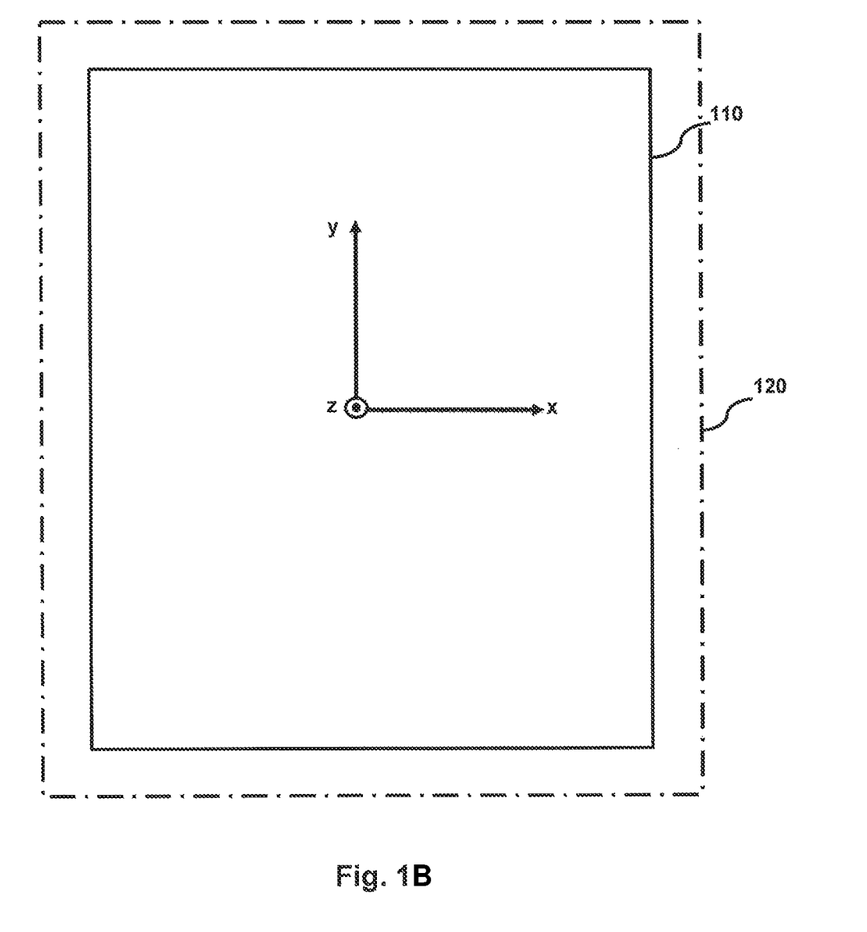
FIG. 1B shows a top view of a variant of the double-glass photovoltaic module of FIG. 1 (A)

In the variant of FIG. 1B, on the other hand, as visible in a top view of the double-glass photovoltaic module 100, whereas the plurality of solar cells 130 is not visible. FIG. 1B shows the embodiment, where the rear glass sheet 120 extends beyond all edges of the front glass sheet 110. According to FIG. 1B that is in the positive and the negative x- and y-direction.

Furthermore, commonly, the thickness (T) of the front glass sheet 110 is equal to the thickness (T) of the rear glass sheet 120. In some cases, however, it may be advantageous to specify the front glass sheet to be thicker than the rear glass sheet and vice versa. Those cases may be, where the thickness of the front glass sheet is reduced to a minimum to reduce the overall weight of the photovoltaic module, but the rear glass sheet has to maintain a certain, predefined thickness to match the clamping element 220 of the frame 210.

Figure 2:
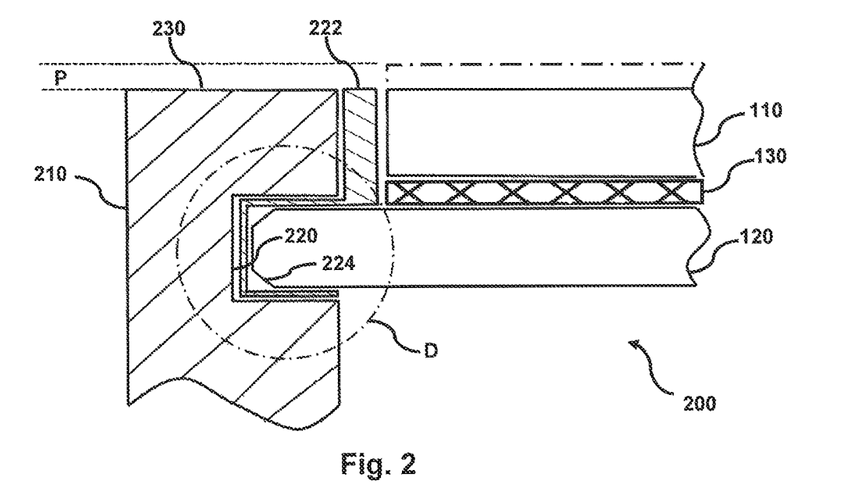
FIG. 2 shows a section-view of an embodiment of a solar panel comprising frame a double-glass photovoltaic module, with a detailed view (S) annotated.

FIG. 2 shows a simplified, more detailed section-view of the solar panel 200, comprising the double-glass photovoltaic module 100 and a corresponding frame 210. For reasons of simplicity, further layers that may be used, for instance for encapsulation of the solar cells, are omitted in FIG. 2. In this section-view, the front glass sheet 110 of the double-glass photovoltaic module 100 is denoted together with the rear glass sheet 120, the plurality of solar cells 130, the frame 210 of the solar panel and the clamping element 220, clamping only the rear glass sheet 120, which in FIG. 2 is shown with simple chamfered edges 224, reducing the sensitivity of the edges against damage and aiding to prevent cuts and thus, increasing safety for the installation personnel. In addition, in FIG. 2 an optional protrusion (P) of the front glass sheet is schematically shown in dotdashed lines, whereas this glass sheet is either flush with a reference plane defined by inner edges of a front face 230 of the frame 210 or protrudes beyond the front face of the frame. A fixation of the double glass photovoltaic module in the frame 210 using only the rear glass sheet 120 is highlighted in FIG. 2 by a dash-dotted circle D. A sealing agent 222, which is suitably made of an elastomer, seals any remaining space between the photovoltaic module 100 and the frame 210. Other suitable sealing agents are per se known in the art. Alternatively, a glue may be used for a particularly strong fixation of the module in the frame.

As can be seen in the cross-sectional view of FIG. 2, the clamping element 220 resembles a rectangular C-shape. It has three faces oriented perpendicularly with respect to each other. Specifically, a bottom face of the C-shaped clamping element is oriented up, facing the rear face of the rear glass sheet 120. Furthermore, a side face is oriented towards the faceted side face 224 of the rear glass sheet 120, and a top face of the claiming element is oriented down, thus facing a top face of the rear glass sheet 120. The bottom face of the claim element 220 is positioned in the frame 210 at a suitable distance from the front face 230 of the frame, such that, taking into account any sealing agent present, the front glass sheet is either flush with a reference plane defined by inner edges of the front face 230 of the frame 210 or even protrudes beyond the front face of the frame.

A sealing procedure can be carried out in a single process step or in two consecutive process steps.

In the former case, an excess of sealing agent 222, suitably in a liquid or viscous state, is inserted into the clamping element 220. Subsequently, the double-glass photovoltaic module 100 is pressed into the clamping element, causing excess sealing agent to be squeezed out of the clamping element 220 and filling the space extending between the front glass sheet 110 and the frame 210. With this method, the double-glass photovoltaic module 100 is fixed in and sealed against the frame 210 in one process step.

Alternatively, in the latter case, the double-glass photovoltaic module 100 is fixed in the frame 210 first and, subsequently, is sealed against the frame 210 thus, using two process steps.

Figure 3:
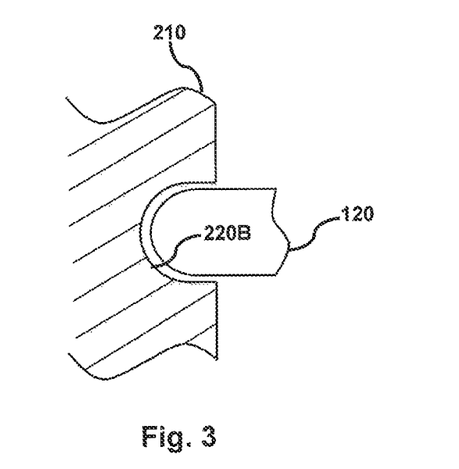
FIG. 3 shows a C-shaped clamping element, formed of the rear glass sheet of the double-glass photovoltaic module and the frame.

FIG. 3 shows a detailed view of an alternative embodiment of the clamping element 220 of the solar panel 200. FIG. 3 is a detailed view restricted in scope to a section corresponding to that indicated by the circle D in FIG. 2 for the above embodiment of the solar panel. In the embodiment shown the clamping element 220A exhibits a C-shape, forming a C-shaped clamping groove. From FIG. 3, it can be seen that this design provides the particular advantages that the rear glass sheet 120 of the double-glass photovoltaic module 100 is automatically well aligned with the frame 210 of the solar panel 200 and, that the double-glass photovoltaic module 100 is instantly held tightly in position which prevents the glass of the photovoltaic module from chipping due to an undesired motion of module in its frame.

Figure 4:
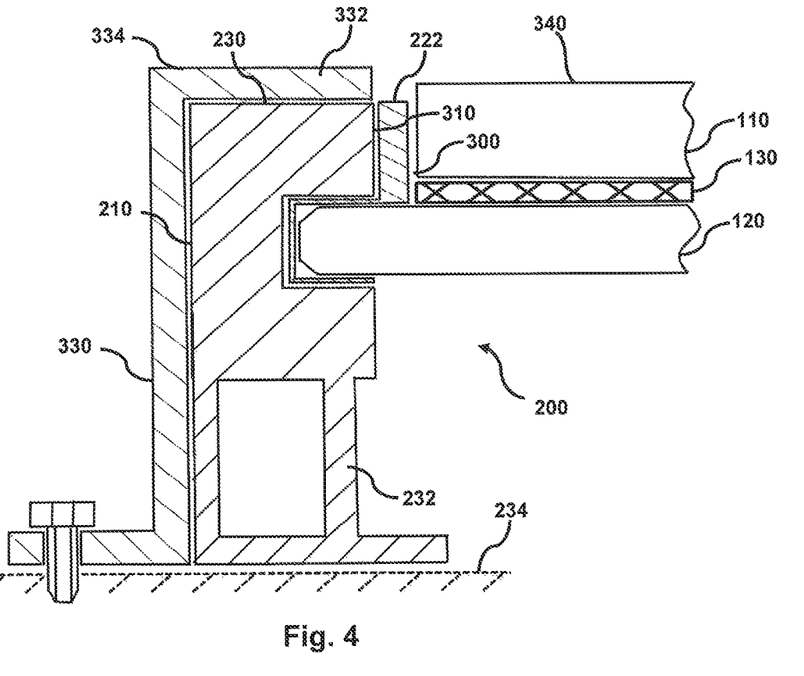
FIG. 4 shows the solar panel with the gap filled with an elastic sealing agent, to seal the photovoltaic module against the frame and a bracket element, to fasten the photovoltaic module to a surface.

In FIG. 4, a detailed section-view of the solar panel 200 is shown. It is illustrated that a gap 300 is formed between an inner surface 310 of the frame 210 and the front glass sheet 110 of the double-glass photovoltaic module 100. The present Figure also shows a bracing means 232 forming a lower part of the frame 210. The bracing means 232 is formed by a hollow profile segment commonly employed to mount the solar panel 200 on roof top surfaces 234 and similar installation locations of solar panels, in conjunction with a bracket element 330, required to establish a, for example, friction-locked connection between the frame 210 and the roof top surface 234, through pressing the frame against the surface.

In the embodiment shown in FIG. 4, the bracket element 330 further has a clamping means 332 that substantially matches an extension of the front face 230 of the frame 210. Therefore, the clamping means 332 does not reach across the front face 340 of the front glass sheet 110 of the double-glass photovoltaic module 100 thus, preventing damage potentially done to the front glass sheet 110, due to a component commonly made from metal clamping down on glass. In addition, it is also possible to further increase the thickness of the front glass sheet, such that it also protrudes beyond the front face 334 of the bracket element 330. This measure can help, avoiding a localised build-up of snow for example, as the front face 340 of the front glass sheet 110 onto which snow may settle, vertically extends beyond the front face 334 of the bracket element 330.

For reasons of simplicity, only one of the many potentially feasible fastening methods of a solar panel 200 is described in the above. For differing fastening methods, similar advantages can be obtained however.

FIG. 4 further shows that the gap 300 is filled with an elastic sealing agent 222 or, alternatively, glue, to seal the photovoltaic module 100 against the frame 210 as is pointed out above. Importantly, the sealing agent 222 is either flush with a front face 230 of the frame 210 or, protrudes beyond the reference plane defined by the inner edges of the front face of the frame 230, but not beyond a plane defined by a front face 340 of the front glass sheet 110.

Figure 5A:
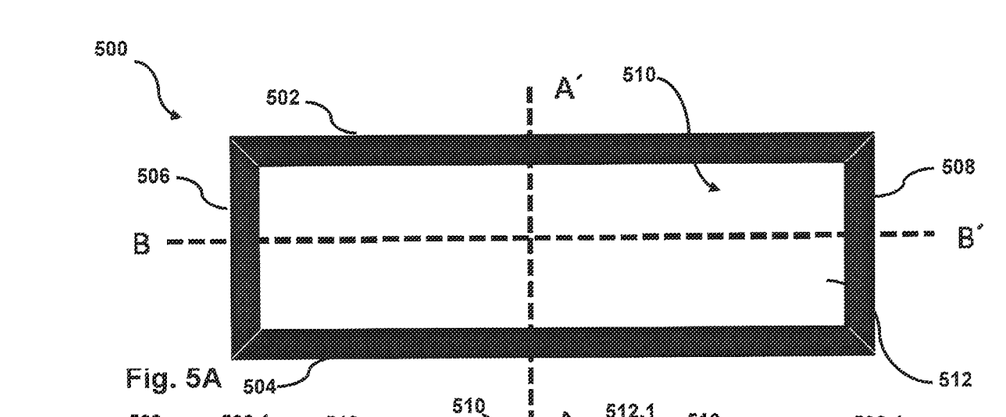
FIG. 5A shows a schematic top view of a solar panel according to a further embodiment.
Figure 5B:
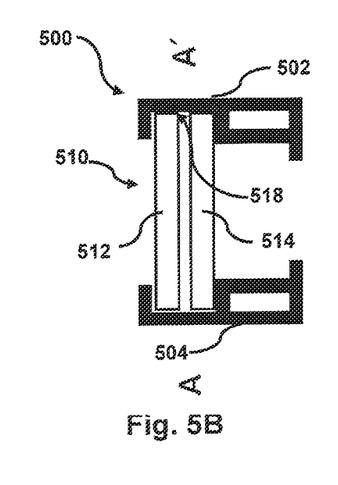
FIG. 5B shows a sectional view of the solar panel of FIG. 5A along the line A-A'.
Figure 5C:
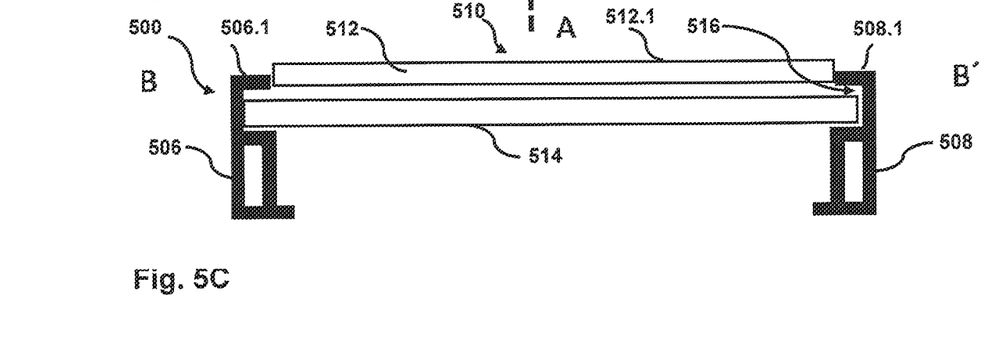
FIG. 5C shows a sectional view of the solar panel of FIG. 5A along the line B-B'.

FIGS. 5A to 5C are different views of a further embodiment of a solar panel. FIG. 5A is a schematic top view of a solar panel according to a further embodiment; FIG. 5B shows a sectional view of the solar panel of FIG. 5A along the line A-A' in FIG. 5A. FIG. 5C show sectional view of the solar panel of FIG. 5A along the line B-B' in FIG. 5A. The following description refers to FIGS. 5A to 5C in parallel.

The solar panel 500 of this embodiment has a rectangular frame made of frame parts 502 to 508. The frame accommodates a double-glass photovoltaic module 510, which is schematically represented in FIGS. 5B and 5C by its front glass sheet 512 and its rear glass sheet 514 only. As can be seen from FIGS. 5B and 5C, the rear glass sheet 514 exhibits a larger extension than the front glass sheet 512 along the line B-B', while the two glass sheets 512 and 514 have the same extension along the line A-A'. Thus, in the present embodiment, the rear glass sheet 514 has a larger extension than the front glass sheet 512 in exactly two directions, one direction pointing along the line B-B' from B to B', and the other direction pointing along the line B-B' the opposite way, i.e., from B' to B.

As illustrated in FIG. 5C, only the rear glass sheet 514 is clamped by a C-shaped first clamping element 516 provided in the frame profile of the frame parts 506 and 508. However, both the front glass sheet and the rear glass sheet are clamped by a second clamping element 518 provided in the frame parts 502 and 504. The second clamping element 518 differs from the first clamping element 516 in having a larger extension of the vertical C-bar of its C-shape than the first clamping element 516. This way, both glass sheets 512 and 514 can be accommodated by the frame parts 502 and 504 only.

Thus, for only two edges (here: the long sides) the frame clamps both glass sheets 512 and 514. Along the other two edges the frame only holds the rear glass 514.

In the present embodiment, the front glass sheet 512 protrudes beyond a front face of the frame that is defined by (and includes) the front faces 506.1 and 508.1 of the frame parts 506 and 508, which are parallel to a front surface 512.1 of the front glass sheet 512. However, on the remaining two sides formed by the frame parts 502 and 504, the frame profile protrudes beyond the front surface 512.1 of the front glass sheet 512, as is per se known from prior art solar panels. However, in comparison with such prior art solar panels, the solar panel 500 allows water and snow to pass along the direction B-B' or VB'-B.

In a variant of the present embodiment, the front glass sheet is flush with the front faces 506.1 and 508.1 In another variant of this embodiment, the two frame parts, from which the front glass sheet 512 protrudes do not form the short sides (506, 508 in FIG. 5) of the panel, but the long sides (502 and 504 in FIG. 5). The two mentioned variants can be combined to form a further variant.

In the embodiment of FIG. 5 and its described variants, only two sides of the frame have to be provided with an unusual frame profile that is configured to hold the rear glass sheet only, whereas for the other two sides, a conventional frame profile that is configured to hold both glass sheets can be used.

Whereas the embodiments shown have the rear glass sheet extend beyond the lateral extension of the front glass sheet in two and four directions, it is of course also possible to have the rear glass sheet extend beyond the lateral extension of the front glass sheet in three directions.

In summary, a solar panel according the present invention comprises a double-glass photovoltaic module mounted in a frame. A rear glass sheet of the double-glass photovoltaic module exhibits a larger extension than the front glass sheet, in at least two spatial directions, as measured in the rear glass sheet plane. The frame comprises a clamping element in its frame profile, which clamps only the rear glass sheet, but not the front glass sheet of the double-glass photovoltaic module. The clamping element is arranged to let the front glass sheet be either flush with a reference plane defined by inner edges of a front face of the frame or protrude beyond the front face of the frame. Among other advantages, the solar panel continuously achieves its desired electrical performance figures in operation without requiring cleaning or similar maintenance expenditure.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A solar panel, comprising:
a double-glass photovoltaic module mounted in a frame, the double-glass photovoltaic module comprising a plurality of solar cells embedded between a front glass sheet, which is to be arranged facing towards the sun in operation of the solar panel, and a rear glass sheet,
wherein the rear glass sheet exhibits a larger extension than the front glass sheet, in at least two spatial directions, as measured in a plane of the rear glass sheet,
wherein the frame comprises a clamping element that is an integral part of a frame profile of the frame and that is configured for mechanically clamping only the rear glass sheet and not the front glass sheet of the double-glass photovoltaic module, such that the photovoltaic module is fixed in position by interaction of the frame engaging with the rear glass sheet alone, and
wherein the front glass sheet is either flush with a reference plane defined by inner edges of a front face of the frame or protrudes beyond the front face of the frame.

2. The solar panel according to claim 1, wherein the rear glass sheet has a rectangular shape.

3. The solar panel according to claim 1, wherein the rear glass sheet extends beyond opposite edges of the front glass sheet on only two opposite sides thereof.

4. The solar panel according to claim 1, wherein in a plan view, the double-glass photovoltaic module and the frame each have a rectangular shape,
wherein the rear glass sheet extends beyond opposite edges of the front glass sheet on only a first pair of mutually opposite rear-glass-sheet sides of the rectangular shape of the double-glass photovoltaic module,
wherein the frame comprises a first pair of mutually opposite frame parts with first clamping elements clamping only the rear glass sheet on the first pair of mutually opposite rear-glass-sheet sides,
wherein the frame comprises second clamping elements on a second pair of mutually opposite frame parts, clamping the rear glass sheet and the front glass sheet, and
wherein only the second pair of mutually opposite frame parts have protruding front face sections of the frame that protrude beyond the front glass sheet.

5. The solar panel according to claim 1, wherein the rear glass sheet extends beyond all edges of the front glass sheet.

6. The solar panel according to claim 1, wherein edges of the front glass sheet that face away from the solar cells are polished.

7. The solar panel according to claim 1, wherein the plurality of solar cells are embedded between a top bedding material and a bottom bedding material.

8. The solar panel according to claim 1, wherein the plurality of solar cells is embedded between the front glass sheet and the rear glass sheet with a clearance in between, and wherein the clearance is filled with air or gas.

9. The solar panel according to claim 1, comprising a bifacial arrangement of the solar cells between the front glass sheet and the rear glass sheet.

10. The solar panel of claim 1, wherein the clamping element clamping the rear glass sheet exhibits a C-shape, thus forming a clamping groove.

11. The solar panel of claim 1, wherein:
a gap is formed between an inner surface of the frame and the front glass sheet of the photovoltaic module, and
the gap is filled with an elastic sealing agent to seal the photovoltaic module against the frame, and the sealing agent is either flush with a front face of the frame or protrudes beyond the reference plane defined by the inner edges of the front face of the frame, but not beyond a plane defined by a front face of the front glass sheet.

12. A photovoltaic power station, having at least one solar panel according to claim 1.

13. A solar panel, comprising:
a double-glass photovoltaic module mounted in a frame, the double-glass photovoltaic module comprising a plurality of solar cells embedded between a front glass sheet, which is to be arranged facing towards the sun in operation of the solar panel, and a rear glass sheet,
wherein the rear glass sheet exhibits a larger extension than the front glass sheet, in at least two spatial directions, as measured in a plane of the rear glass sheet,
wherein the frame comprises a clamping element clamping only the rear glass sheet and not the front glass sheet of the double-glass photovoltaic module,
wherein the front glass sheet is either flush with a reference plane defined by inner edges of a front face of the frame or protrudes beyond the front face of the frame,
wherein in a plan view, the double-glass photovoltaic module and the frame each have a rectangular shape,
wherein the rear glass sheet extends beyond opposite edges of the front glass sheet on only a first pair of mutually opposite rear-glass-sheet sides of the rectangular shape of the double-glass photovoltaic module,
wherein the frame comprises a first pair of mutually opposite frame parts with first clamping elements clamping only the rear glass sheet on the first pair of mutually opposite rear-glass-sheet sides,
wherein the frame comprises second clamping elements on a second pair of mutually opposite frame parts, clamping the rear glass sheet and the front glass sheet, and
wherein only the second pair of mutually opposite frame parts have protruding front face sections of the frame that protrude beyond the front glass sheet.

* * * * *